(12) United States Patent
Zhao (10) Patent No.: US 11,302,763 B2
(45) Date of Patent: Apr. 12, 2022

(54) FLEXIBLE OLED DISPLAY PANEL AND MANUFACTURING METHOD THEREOF

(71) Applicant: Wuhan China Star Optoelectronics Semiconductor Display Technology Co., Ltd., Hubei (CN)

(72) Inventor: Jiaxiang Zhao, Hubei (CN)

(73) Assignee: WUHAN CHINA STAR OPTOELECTRONICS SEMICONDUCTOR DISPLAY TECHNOLOGY CO. LTD., Wuhan (CN)

(*) Notice: Subject to any disclaimer, the term of this patent is extended or adjusted under 35 U.S.C. 154(b) by 674 days.

(21) Appl. No.: 16/317,309

(22) PCT Filed: Dec. 21, 2018

(86) PCT No.: PCT/CN2018/122603
§ 371 (c)(1),
(2) Date: Jan. 11, 2019

(87) PCT Pub. No.: WO2020/077815
PCT Pub. Date: Apr. 23, 2020

(65) Prior Publication Data
US 2021/0335971 A1  Oct. 28, 2021

(30) Foreign Application Priority Data

Oct. 16, 2018 (CN) .......................... 201811199842.9

(51) Int. Cl.
*H01L 27/32* (2006.01)
*H01L 51/56* (2006.01)
*H01L 51/00* (2006.01)

(52) U.S. Cl.
CPC .......... *H01L 27/3276* (2013.01); *H01L 51/56* (2013.01); *H01L 51/0097* (2013.01); *H01L 2227/323* (2013.01); *H01L 2251/5338* (2013.01)

(58) Field of Classification Search
CPC .................................................. H01L 27/3276
See application file for complete search history.

(56) References Cited

U.S. PATENT DOCUMENTS

| | | | | |
|---|---|---|---|---|
| 10,192,949 | B2* | 1/2019 | Choi | H01L 51/0097 |
| 2017/0277288 | A1* | 9/2017 | Choi | G06F 3/0412 |
| 2018/0033979 | A1* | 2/2018 | Jang | B32B 3/08 |

(Continued)

FOREIGN PATENT DOCUMENTS

| | | |
|---|---|---|
| CN | 207116427 U | 3/2018 |
| CN | 107994055 A | 5/2018 |

(Continued)

*Primary Examiner* — Douglas M Menz
(74) *Attorney, Agent, or Firm* — Geoffrey A. Lottenberg; Berger Singerman LLP (57) ABSTRACT

A flexible organic light emitting diode (OLED) display panel and a manufacturing method thereof utilize a deep hole formed in a bending area and an organic film layer having an island structure pattern on the deep hole to allow metal wires to have a longer length for bending and to enlarge a bending surface area of the metal wires in the bending area, thereby reducing the stress applied on the metal wires in bending, mitigating a damage caused by the bending of the metal wires, and extending a lifespan of the display panel in bending.

8 Claims, 5 Drawing Sheets

(56) References Cited

U.S. PATENT DOCUMENTS

| | | | |
|---|---|---|---|
| 2018/0123060 A1* | 5/2018 | Jang | H01L 27/1218 |
| 2018/0182838 A1* | 6/2018 | Yeo | H01L 27/3288 |
| 2018/0247992 A1* | 8/2018 | Cho | H01L 23/5283 |
| 2019/0081257 A1* | 3/2019 | Kim | H01L 51/5072 |
| 2019/0148474 A1 | 5/2019 | Bu | |
| 2019/0355761 A1* | 11/2019 | Chang | H01L 27/1262 |
| 2020/0013970 A1* | 1/2020 | Wang | H01L 27/3276 |
| 2020/0150725 A1* | 5/2020 | Saitoh | H01L 51/0097 |
| 2020/0258972 A1* | 8/2020 | Kim | H01L 51/52 |
| 2020/0341516 A1* | 10/2020 | Huang | G09F 9/301 |
| 2021/0264820 A1* | 8/2021 | Wang | B32B 27/08 |

FOREIGN PATENT DOCUMENTS

| | | |
|---|---|---|
| CN | 108022942 A | 5/2018 |
| CN | 108231800 A | 6/2018 |
| CN | 108288437 A | 7/2018 |

* cited by examiner

FLEXIBLE OLED DISPLAY PANEL AND MANUFACTURING METHOD THEREOF

BACKGROUND OF INVENTION

1. Field of Invention

The present invention relates to a display field, and particularly to a flexible organic light emitting diode (OLED) display panel and a manufacturing method thereof capable of reducing stress on metal wires when bending.

2. Related Art

Organic light emitting diode (OLED) display technology has been developed rapidly in recent years prompting curving and flexible display products into the markets, and related technology fields are ever-changing as well. OLEDs refer to diodes emitting light by carrier injection and recombination under an electric field driven by an organic semiconductor material and a luminescent material. OLED displays have advantages of high contrast, wide color gamut, wide viewing angles, and light weight, and thus quickly occupy the high-end market of display panels. Other advantages of OLED displays are that they are bendable, foldable, and curable, making them widely used on curved screens, foldable screens, or narrow border (no border) screens.

Figure 1:
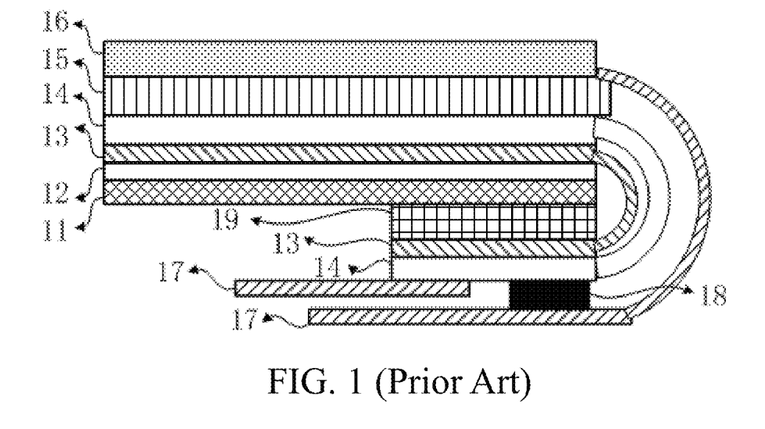
FIG. 1 is a schematic view showing a curved structure of a conventional flexible screen.

Please refer to FIG. 1 showing a schematic view of a curved structure of a conventional flexible screen. The flexible screen has a substrate (CU) 11, a pad 12 made of foam, a backplate (BP) 13, a panel 14, a touch panel (TP) 15, a polarizer (POL) 16, a flexible printed circuit (FPC) 17 bending toward a backside of the flexible screen, a drive IC 18, a backplate 13, a panel 14, and a second backplate 19. A lower border of the screen is bendable to enable a lower border of an array substrate including the drive IC and the FPC to be bent towards the backside of the screen for bonding, thereby to increase screen ratio and to fulfill the purpose of reducing width of borders.

In current technology, the flexible display screen is mainly added with a deep hole (DH) in a bending area of a pad area (PA) during an array process. That is, an inorganic film layer in the bending area not easy to be bent is etched to form the DH, in which a flexible organic material (O-ILD) is filled, for example, polyimide (PI). In practical processes, PI is firstly coated by a PI coater, then a mask is utilized to cover a portion needed to be retained, and other portions are exposed and developed. In this manner, an O-ILD film exists on two opposite sides of an upper portion of the DH to provide protection for thin-film transistor (TFT) components and to release bending stress.

With respect to stress release from metal in the bending area in the current technology, it is realized by utilizing bend-resistance metal wires in the bending area to connect metal wires of a fanout portion below an active area (AA) with metal wires of a drive IC, thereby to realize smooth transmission of electrical signals. For example, metal wires of source and drain (SD) layers having greater toughness (e.g. Ti—Al—Ti composite material) and metal wires of a gate layer (e.g. Mo metal) are utilized to mitigate the damage on metal wires in the bending area. Alternatively, the metal wires are configured with a chain-shaped structure or a hole-shaped structure to deform under a condition of bending, thereby to mitigate damage of the internal structure of the metal caused by the stress.

Figure 2A:
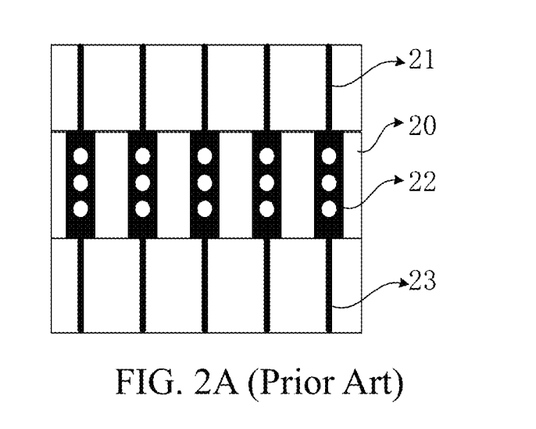
FIGS. 2A-2B are schematic structural views of metal wires in a bending area of a conventional flexible screen.
Figure 2B:
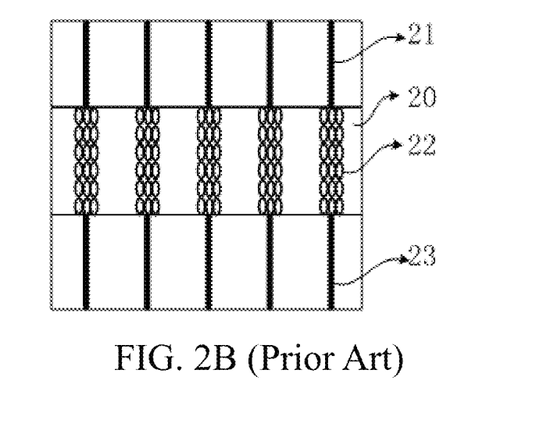

As shown in FIGS. 2A-2B illustrating schematic structural views of metal wires of a bending area of a conventional flexible screen, metal wires of FIG. 2A have a hole-shaped structure, metal wires of FIG. 2B have a chain-shaped structure. Metal wires 22 in a bending area 20 are configured to have the hole-shaped structure or the chain-shaped structure (the figures schematically show the metal wires 22 in an enlarged state) to connect metal wires 21 of a fanout portion below an active area (AA) with metal wires 23 of a drive IC, thereby to realize smooth transmission of electrical signals. The hole-shaped or chain-shaped metal wires can mitigate the damage caused by stress on metal wires in the bending area, while a length of the metal wires in the bending area is not changed.

The current technology is mainly to change the structure of the metal wires to mitigate the damage of the internal structure of metal caused by the stress under deformation. However, the length of the metal wires in the bending area is not changed and therefore cannot effectively reduce the stress applied on the metal wires when bending.

SUMMARY OF INVENTION

An object of the present invention is to provide a flexible organic light emitting diode (OLED) display panel and manufacturing method thereof, capable of reducing the stress applied on metal wires in bending, further mitigating a damage caused by the bending of the metal wires, and improving quality of the display panel.

To achieve the above-mentioned object, the present invention provides a flexible organic light emitting diode (OLED) display panel comprises a deep hole formed in a bending area, an organic film layer disposed in the bending area, and a metal wiring layer disposed on the organic film layer; an island structure formed in the bending area by the organic film layer, wherein the island structure has protrusions evenly distributed in the bending area; and the metal wiring layer having metal wires in the bending area, wherein the metal wires have a shape adapted to a shape of the island structure, and wiring width of the metal wires being same in the bending area.

To achieve the above-mentioned object, the present invention further provides a flexible organic light emitting diode (OLED) display panel comprising a deep hole formed in a bending area, an organic film layer disposed in the bending area, and a metal wiring layer disposed on the organic film layer; and an island structure formed in the bending area by the organic film layer; wherein the metal wiring layer has metal wires in the bending area, and the metal wires have a shape adapted to a shape of the island structure.

To achieve the above-mentioned object, the present invention further provides a method of manufacturing a flexible organic light emitting diode (OLED) display panel, the method comprising providing a flexible substrate, and forming an inorganic film layer on the flexible substrate; forming a deep hole having slopes on the inorganic film layer in a bending area; forming, by coating an organic material on the deep hole, an organic film layer, and patterning, by a halftone mask through a patterning process, a surface of the organic film layer; forming an island structure in the bending area; and forming a metal wiring layer on the organic film layer of the island structure, wherein the metal wiring layer has metal wires in the bending area, and the metal wires have a shape adapted to a shape of the island structure.

The present invention has advantages as follows: the present invention utilizes the deep hole formed in the bending area and the organic film layer having the island structure pattern on the DH to allow the metal wires to have a longer length for bending and to enlarge a bending surface area of the metal wires in the bending area, thereby reducing the stress applied on the metal wires in bending, mitigating a damage caused by the bending of the metal wires, and extending a lifespan of the display panel in bending.

BRIEF DESCRIPTION OF DRAWINGS

To describe the technical solutions in the embodiments of the present invention, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

Hereafter, embodiments of the present invention will be described in detail with reference to the accompanying drawings, wherein same or like reference numerals designate same or like elements or elements having same or like functions throughout the specification. The embodiments described with reference to the accompanying drawings are to be regarded as illustrative to only explain the present invention, and not to be construed as limiting the present invention.

In the present invention, unless otherwise expressly specified or limited, the first feature being "on" or "lower" the second feature may include direct contact of the first and the second features and may also include that the first and the second features are not in direct contact, but in contact by the additional features therebetween. Also, the first feature being "on", "above", "upper" the second feature may include that the first feature is obliquely upward, directly above the second feature, or simply represent that a level of the first feature is higher than that of the second feature. The first feature being "beneath", "below" and "lower" the second feature may include that the first feature is obliquely downward and right below the second feature, or simply represent that a level of the first feature is less than that of the second feature.

The following disclosure provides many different embodiments or examples to achieve different structures of the present invention. To simplify the disclosure of the present invention, the components and configuration of specific examples are described hereinafter. Of course, they are only illustrative, and are not intended to limit the present invention. Further, the present disclosure may repeat reference numerals in different embodiments and/or the reference letters. This repetition is for the purpose of simplicity and clarity, and does not indicate a relationship between the various embodiments and/or set in question. Further, the present invention provides various specific examples of materials and processes, but one of ordinary skill in the art may be appreciated that other processes and applications and/or other materials.

A flexible organic light emitting diode (OLED) display panel of the present invention includes a deep hole formed in a bending area, an organic film layer disposed in the bending area, and a metal wiring layer disposed on the organic film layer. An island structure is formed in the bending area by the organic film layer. The metal wiring layer has metal wires in the bending area, wherein the metal wires have a shape adapted to a shape of the island structure.

The present invention utilizes the deep hole (DH) formed in the bending area and the organic film layer having an island structure pattern on the DH to allow the metal wires to have a longer length for bending and to enlarge a bending surface area of the metal wires in the bending area, thereby reducing stress applied on the metal wires in bending, mitigating a damage caused by the bending of the metal wires, and extending a lifespan of the display panel in bending.

Figure 3:
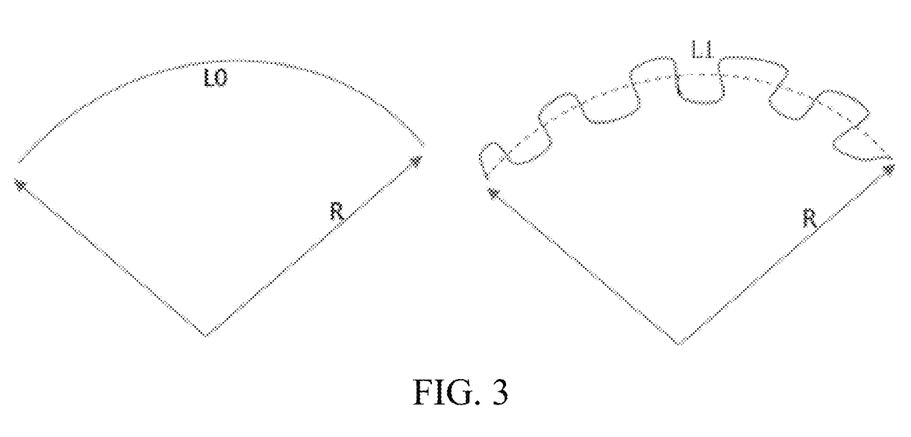
FIG. 3 is a schematic structural view of metal wires bent in a bending area of a flexible organic light emitting diode (OLED) display panel in accordance with an embodiment of the present invention.

FIG. 3 is a schematic structural view of metal wires bent in a bending area of a flexible OLED display panel in accordance with an embodiment of the present invention. A right part of FIG. 3 shows patterned metal wires of the present invention, and the left part shows conventional straight-line type of metal wires in comparison. By designing a specific film layer structure in the bending area, the relative surface area of the metal wires (e.g. source/drain metal wires) in the bending area is increased, wherein the relative surface area of the metal wires in the bending area is defined as: a ratio of a surface area S1 of the bending surface of the patterned metal wires in the bending area to a projected area S0 of the bending metal wires, or a length L1 of the patterned metal wires in the bending area to a length L0 of conventional metal wires in the bending area. When the bending wires have a same width, $S1/S0=L1/L0$. In comparison with a conventional metal wire structure in the bending area, when the relative surface area of the patterned metal wires in the bending area is 1.5 times that of the conventional metal wires, the stress applied on a unit area is decreased by 33% (excluding structural advantages). By improving the structure of the organic film layer on the DH in the bending area and the metal wiring layer, it is capable of effectively releasing the stress generated by bending, mitigating the damage caused by the bending of the metal wires, and extending a lifespan of the display panel in bending.

Figure 4:
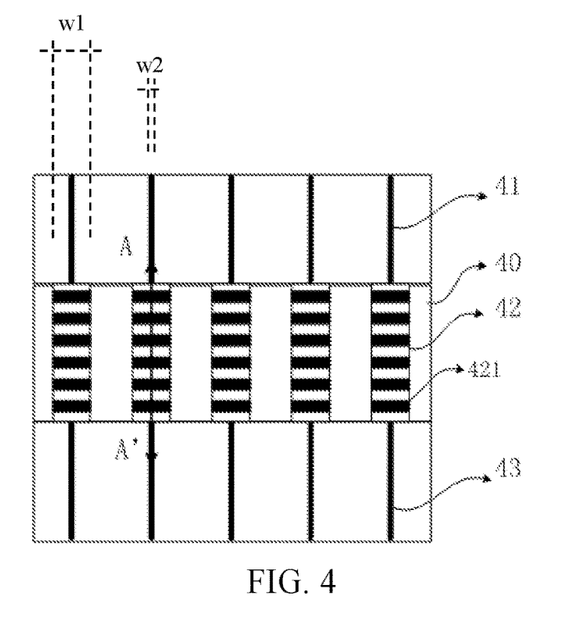
FIG. 4 is a schematic structural view of metal wires in a bending area of a flexible OLED display panel in accordance with an embodiment of the present invention.

FIG. 4 is a schematic structural view of metal wires in a bending area of a flexible OLED display panel in accordance with an embodiment of the present invention. As shown in FIG. 4, the metal wires are continuous wires made of a same material. A block pattern is only used to indicate the distribution of protrusions of the island structure corresponding to the organic film layer, and is not to cut off the metal wires. In a bending area 40, patterned metal wires 42 (as shown by a schematic enlarged view) connect fanout metal wires 41 of a fanout portion below an active area (AA) with driving metal wires 43 of a drive IC to realize smooth transmission of electrical signals. By the protrusions of the island structure, it is capable of increasing the relative surface area of the patterned metal wires 42 in the bending area 40, releasing the stress generated by bending, mitigating the damage caused by the bending of the metal wires, and extending a lifespan of the display panel in bending.

The patterned metal wires 42 in the bending area 40 can release the stress when bending, and the organic film layer (not shown in the figure) has better bending performance. Therefore, the display panel can be bent along the bending area without generating cracks or holes. After an OLED luminescent material and an encapsulation layer are evaporated, a lower frame area (border) of the entire display panel can be bent backward to directly bond a flexible printed circuit (FPC) to the driving IC, thereby to minimize a size of the lower frame area of a screen, which facilitates a narrow borderscreen.

In this embodiment, the metal wires 42 have a same wiring width w1 in the bending area 40, and the wiring width w1 is greater than a width w2 of each of the fanout metal wires 41. Protrusions (corresponding to reference no. 421 in the figure) have a same shape. The protrusions having the same shape are evenly distributed in the bending area 40 and are manufactured through a same process, simplifying manufacturing processes. In other embodiments, a distribution density of a plurality of protruding holes in the bending area 40 is gradually reduced from an area where the stress is greatest at the time of bending to an area where the stress is the smallest, so that the metal wires in the bending area where the stress is relatively great correspondingly have a larger relative surface area to enable efficient release of the stress in bending, which mitigates the damage on the metal wires in bending. The metal wires in the bending area where the stress is relatively small correspondingly have a smaller relative surface area.

Preferably, the metal wires 42 in the bending area are further configured in a hole-shaped structure which can be referred to FIG. 2A. By the hole-shaped structure formed on the patterned metal wires 42, the stress is released from the hole-shaped structure when the metal wires 42 bend to improve the bending performance of the display panel.

Figure 5A:
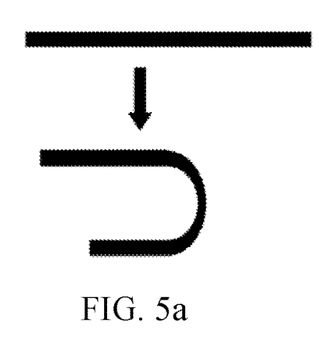
FIGS. 5A-5C are schematic structural views showing metal wires of a flexible OLED display panel bending from a non-bending status in accordance with an embodiment of the present invention.
Figure 5B:
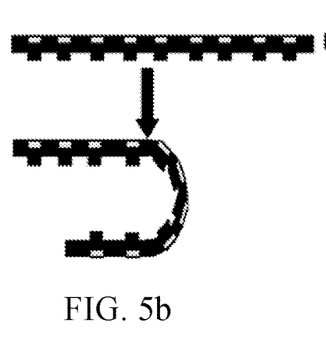
Figure 5C:
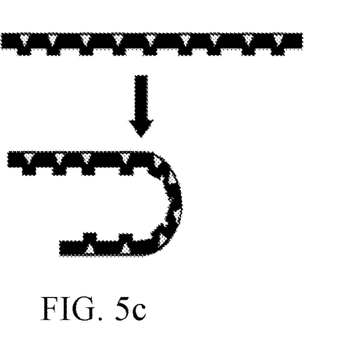

FIGS. 5a-5c are schematic structural views showing metal wires of a flexible OLED display panel bending from a non-bending status in accordance with an embodiment of the present invention. FIGS. 5b and 5c show the patterned metal wires of the present invention, and FIG. 5a shows conventional straight-line type of metal wires in comparison. The present invention utilizes the protrusions of the island structure of the organic film layer to increase the relative surface area of the metal wires in the bending area, release the stress generated by bending the metal wires, mitigate the damage on the metal wires in bending, and improve the lifespan of the display panel in bending. In FIG. 5b the protrusions of the island structure are square in shape and evenly distributed. In FIG. 5c the protrusions of the island structure are triangular in shape and evenly distributed. In other embodiments, the protrusions of the island structure are trapezoid in shape and evenly distributed. The protrusions of the island structure can be evenly or unevenly distributed in the bending area. The protrusions are only used to describe a manner of increasing the relative surface area, and not to limit the structure.

Figure 6:
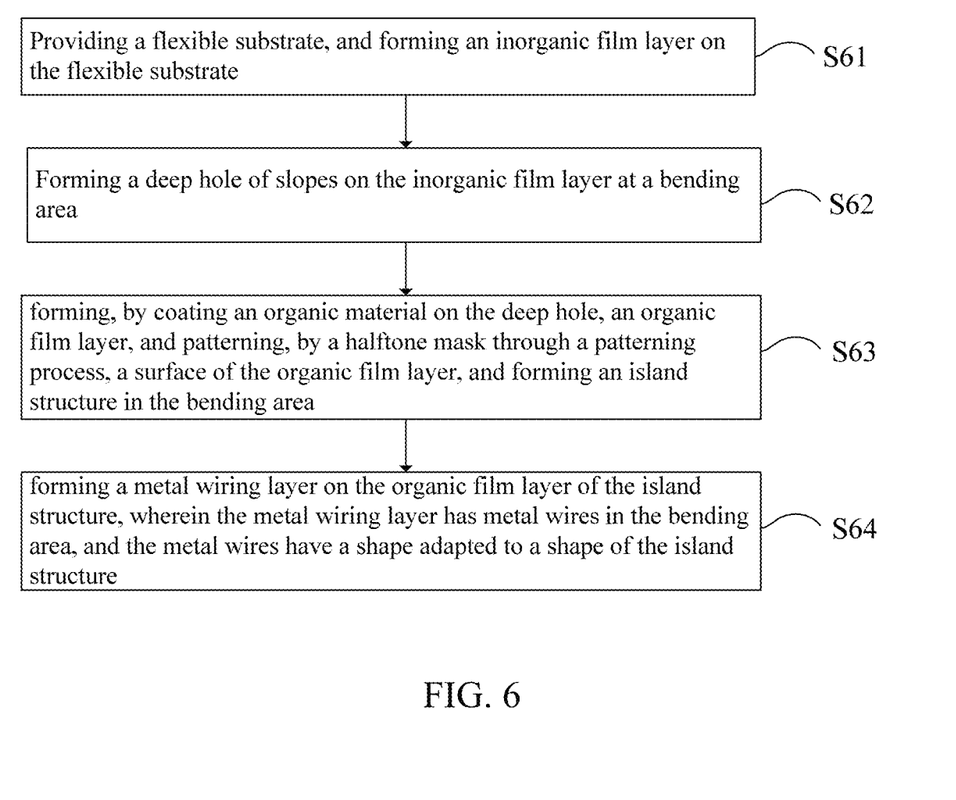
FIG. 6 is a flowchart of a method of manufacturing a flexible OLED display panel in accordance with an embodiment of the present invention.
Figure 7:
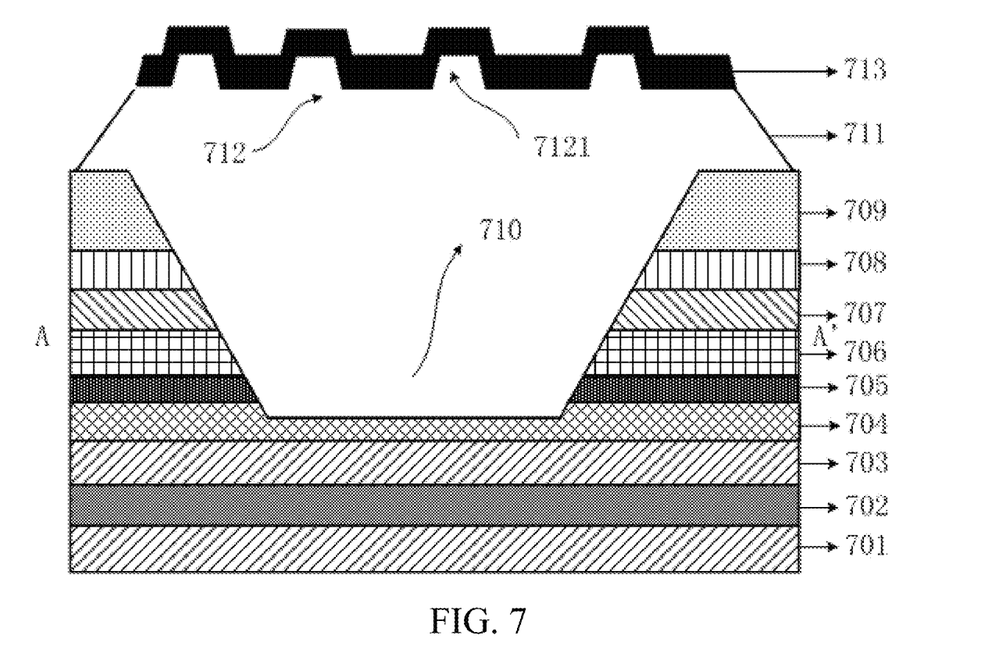
FIG. 7 is a schematic view of a flexible OLED display panel in accordance with an embodiment of the present invention.

The present invention further provides a method of manufacturing a flexible OLED display panel. Please refer to FIG. 6 and FIG. 7, wherein FIG. 6 is a flowchart of a method of manufacturing the flexible OLED display panel in accordance with an embodiment of the present invention, and FIG. 7 is a schematic view of the flexible OLED display panel in accordance with an embodiment of the present invention and is a cross-sectional view taken along the line AA' in FIG. 4. The method includes steps of: S61: providing a flexible substrate, and forming an inorganic film layer on the flexible substrate; S62: forming a deep hole having slopes on the inorganic film layer in a bending area; S63: forming an organic film layer by coating an organic material on the deep hole, patterning a surface of the organic film layer by a halftone mask through a patterning process, and forming an island structure in the bending area; and S64: forming a metal wiring layer on the organic film layer of the island structure, wherein the metal wiring layer has metal wires in the bending area, and the metal wires have a shape adapted to a shape of the island structure.

In the step S61: providing a flexible substrate, and forming an inorganic film layer on the flexible substrate. First, provide a bendable flexible substrate. Please refer to FIG. 6 in combination of FIG. 7. In this embodiment, the flexible substrate includes a first organic layer 701, an organic buffer layer (PI buffer) 702, and a second organic layer 703. By providing two organic layers, it is capable of protecting the inorganic layer from being broken easily and peeled off, and the performance of the flexible substrate is more stable. The second organic layer 703 and the first organic layer 701 are made of a same material. For example, the second organic layer 703 and the first organic layer 701 are made of polyimide (PI), which has features of high temperature resistance, a wide temperature range, no obvious melting point, high insulation performance, and a stable dielectric constant. In another embodiment, the second organic layer 703 and the first organic layer 701 are made of different materials. Specifically, the materials can be one or more of polymer materials such as polyethylene naphthalate, polyethylene terephthalate, polyarylate, polycarbonate or polyetherimide.

In the bending area, according to the flexible process flow, after forming an active layer/a gate layer (GE1)/a second get layer (GE2)/an interlayer dielectric layer (ILD) on the flexible substrate, a deep hole (DH) starts forming. The inorganic layer includes a barrier layer, a buffer layer, an active layer, an insulation layer (nano-silicon oxide (SiOx) and/or nano-silicon nitride (SiNx)), a gate insulation layer, a gate layer, an interlayer dielectric layer, and so on, but not limited thereto. A manufacturing method thereof can refer to a method for manufacturing a display panel in prior art, which is not limited herein. Please refer to FIG. 6 in combination with FIG. 7. In this embodiment, the inorganic film layer includes a barrier layer 704, a silicon nitride (SiNx) layer 705, a silicon oxide (SiOx) layer 706, a first gate insulation layer (GI1) 707, a second gate insulation layer (GI2) 708, and an interlayer insulation layer (ILD) 709.

In the step S62: forming a deep hole having slopes on the inorganic film layer in a bending area. One or two DH processes can be performed according to different situations. A deep hole having slopes can be formed by etching. A method and process of etching can refer to the method for manufacturing a display panel in prior art, which is not limited herein. Please refer to FIG. 6 in combination with FIG. 7. In this embodiment, a bottom of a deep hole 710 is located on the flexible substrate.

In the step S63: forming an organic film layer by coating an organic material on the deep hole, patterning a surface of the organic film layer by a halftone mask through a patterning process, and forming an island structure in the bending area. After being formed, the deep hole is filled with an organic material to form the organic film layer. The organic film layer is disposed over the inorganic film layer, and bending performance of the organic film layer is significantly improved in comparison with that of the inorganic film layer. The organic film layer can be made of polyimide (PI). Please refer to FIG. 6 in combination with FIG. 7. In this embodiment, an organic film layer 711 is formed by uniformly coating polyimide through a PI coater on an interlayer insulation layer 709 and the deep hole 710. A surface of the organic film layer 711 is patterned by the halftone mask through the patterning process, so that the surface of the organic film layer 711 is patterned and roughened. Form an island structure 712 in the bending area, and then carry on a deposition process for the metal wiring layer. The island structure 712 has protrusions 7121 evenly distributed in the bending area. The protrusions 7121 are triangular, trapezoid, or square in shape.

In the step S64: forming a metal wiring layer on the organic film layer of the island structure, wherein the metal wiring layer has metal wires in the bending area, and the metal wires have a shape adapted to a shape of the island structure. Please refer to FIG. 6 in combination with FIG. 7. In this embodiment, a metal wiring layer 713 is formed on the island structure 712 of the patterned organic film layer 711, so that the metal wiring layer 713 maintains a shape of a shape of the island structure 712 of the organic film layer 711, thereby to increase the relative surface area of the metal wires in the bending area, release the stress generated by bending the metal wires, mitigate the damage on the metal wires in bending, and improve the lifespan of the display panel in bending. The metal wiring layer 713 can be a source/drain (SD) layer. By performing a SD process on the island structure 712 of the organic film layer 711, SD wires maintain a shape of the shape of the island structure 712. The SD process can refer to the method for manufacturing a display panel in prior art, which is not limited herein.

The metal wires of the metal wiring layer 713 have a same wiring width in the bending area. The metal wires of the metal wiring layer 713 in the bending area are further configured in a hole-shaped structure. By the hole-shaped structure formed on the patterned metal wires, the stress is released from the hole-shaped structure when the metal wires bend to improve the bending performance of the display panel. Holes can be square, round, polygonal, etc. The metal wires of the metal wiring layer 713 in the bending area are further configured in a chain-shaped structure. By the chain-shaped structure formed on the patterned metal wires, the stress is released from junctures of the chain-shaped structure when the metal wires bend to improve the bending performance of the display panel.

The subject matter of the present application is feasible to be manufactured and used in the industry, and thus has the industrial applicability.

What is claimed is:

1. A flexible organic light emitting diode (OLED) display panel, comprising:
a deep hole formed in a bending area, an organic film layer disposed in the bending area, and a metal wiring layer disposed on the organic film layer;
an island structure disposed in the bending area and included in the organic film layer, wherein the island structure has protrusions evenly distributed in the bending area; and
the metal wiring layer having fanout metal wires, driving metal wires, and patterned metal wires connected between the fanout metal wires and the driving metal wires in the bending area, wherein the patterned metal wires have a shape adapted to a shape of the island structure, wherein wiring width of each of the patterned metal wires measured in a direction parallel to a width direction of each of the fanout metal wires is same in the bending area and is greater than a width of each of the fanout metal wires.

2. The flexible OLED display panel of claim 1, wherein each of the protrusions of the island structure is triangular, trapezoid, or square in shape.

3. The flexible OLED display panel of claim 1, wherein the patterned metal wires in the bending area are further configured in a hole-shaped structure.

4. The flexible OLED display panel of claim 1, wherein the patterned metal wires in the bending area are further configured in a chain-shaped structure.

5. A method of manufacturing a flexible organic light emitting diode (OLED) display panel, the method comprising:
providing a flexible substrate, and forming an inorganic film layer on the flexible substrate;
forming a deep hole having slopes on the inorganic film layer in a bending area;
forming, by coating an organic material on the deep hole, an organic film layer, and patterning, by a halftone mask through a patterning process, a surface of the organic film layer;
forming an island structure in the bending area, wherein the island structure has protrusions evenly distributed in the bending area; and
forming a metal wiring layer on the organic film layer of the island structure, wherein the metal wiring layer has fanout metal wires, driving metal wires, and patterned metal wires connected between the fanout metal wires and the driving metal wires in the bending area, and the patterned metal wires have a shape adapted to a shape of the island structure, wherein wiring width of each of the patterned metal wires measured in a direction parallel to a width direction of each of the fanout metal wires is same in the bending area and is greater than a width of each of the fanout metal wires.

6. The manufacturing method of claim 5, wherein each of the protrusions of the island structure is triangular, trapezoid, or square in shape.

7. The manufacturing method of claim 5, wherein the patterned metal wires in the bending area are further configured in a hole-shaped structure.

8. The manufacturing method of claim 5, wherein the patterned metal wires in the bending area are further configured in a chain-shaped structure.

* * * * *